Nov. 8, 1966 F. PEARLSTEIN 3,284,322
SPLITTING PLATED-THROUGH HOLES OF PRINTED CIRCUIT BOARDS INTO TWO CONDUCTIVE SEGMENTS
Filed Aug. 26, 1963
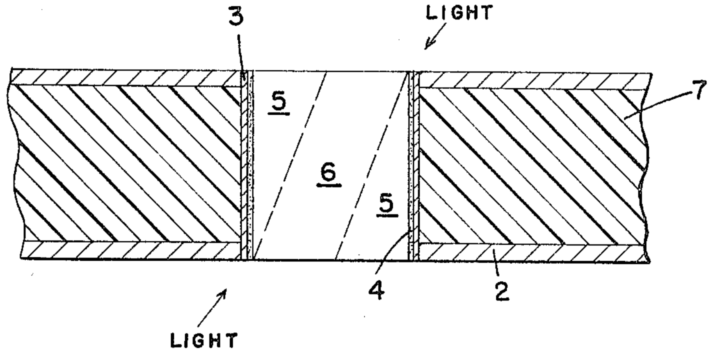
INVENTOR.
FRED PEARLSTEIN
BY Harry M. Saragovitz,
Edward J. Kelly,
Herbert Berl &
S. Dubroff
ATTORNEYS.

3,284,322
Patented Nov. 8, 1966

3,284,322

SPLITTING PLATED-THROUGH HOLES OF PRINTED CIRCUIT BOARDS INTO TWO CONDUCTIVE SEGMENTS

Fred Pearlstein, Philadelphia, Pa., assignor to the United States of America as represented by the Secretary of the Army Filed Aug. 26, 1963, Ser. No. 304,747
3 Claims. (Cl. 204—15)

The invention described herein may be manufactured and used by or for the Government for governmental purposes without the payment to me of any royalty thereon.

This invention relates to an improvement in a method for making printed circuits and particularly, to an improvement in a method for providing multiple connections between both sides of a printed circuit board through a single hole.

In the design of printed circuits and the manufacture of printed circuit boards an all-important consideration is the number of connections required between opposite sides of the circuit boards. Holes in such boards are universally employed to permit these connections to be made. Prior art means for effecting the connections generally involve a wiring process in the case of unplated holes or a physical splitting process in the case of plated holes. The wiring process, comprising merely the use of several wires connected through a single hole, is unsatisfactory when a large number of holes are involved since the wires must be insulated one from the other and attached to the circuit individually. The physical splitting process, involving the physical alteration, e.g., filing, of a plated-through hole to split the conductive layer into two or more segments, cannot be used where it is necessary for the circular shape of the hole to be retained.

Accordingly, a principal object of the present invention is to provide an improved method of making printed circuits which method provides a simple, efficient and economical solution to the problem of multiple connections between opposite sides of a printed circuit board and is unattended by the aforementioned disadvantages of the prior art.

Another object of the invention is to provide a method for splitting plated-through holes in printed circuit boards in a manner admitting of mass production.

Still another object of the invention is to provide a method for splitting plated-through holes in printed circuit boards into two conductive segments.

The above and other objects will in part be obvious and in part be pointed out hereinafter in the following detailed description and accompanying drawing.

The drawing depicts a cross-sectional view of a typical printed circuit board in the vicinity of a hole. The main body 7 of the printed circuit board is made generally of plastic laminate or other non-conductive material and is clad on both sides with a conductive cladding 2 of a metal such as copper. A hole provided in the printed circuit board has its sides coated with a thin film of conductive metal 3, e.g., electroless copper. In the operation of the inventive method this film is in turn coated with a photosensitive resist 4 which can be "set" by exposure to light. Two beams of light are then directed toward the sides of the hole as shown to produce two illuminated areas 5 separated by shadows 6. The difference in solubility between "unset" and "set" resist (unset resist is soluble in a solvent such as trichlorethylene whereas set resist is relatively insoluble therein but can be removed by certain aqueous alkaline solutions such as trisodiumphosphate, for example) whereby exposed conductive metal film may be removed to effect the desired splitting.

The invention is based upon the discovery that when a beam of light is obliquely directed toward a hole in an opaque material, a shadow may be cast over more than half the area of the hole sides. It has been found that this effect is easily achieved by routine adjustment of the direction of the beam of light. In the operation of the inventive method two such beams of light are disposed on opposite sides of a printed circuit board provided with plated-through holes, the sides of which are coated with a photosensitive resist. The directions of the light beams are adjusted toward the hole sides to achieve the desired effect of illuminated areas separated by shadow. After a sufficient period of exposure the illuminated resist "sets" and the remainder of the resist is removed by dissolution with trichlorethylene. The underlying metal film which is now bared is etched away to effect separation of the conductive paths represented thereby. Remaining resist, i.e., set resist, is then removed with a suitable alkaline solution and the thickness of the underlying conductive paths is built up by electroplating.

It is understood that various changes may be made in the method of the invention and that materials other than those specifically described herein may be used without departing from the spirit and scope of the invention.

Having thus described the invention so that others skilled in the art may be able to understand and practice the same,

I claim:

1. A method of splitting plated-through holes of opaque, printed circuit boards into conductive segments comprising the steps of applying a photosensitive resist to the sides of said holes, disposing beams of light on opposite sides of said boards, obliquely directing said beams of light toward the sides of said holes to produce thereon illuminated areas separated by shadow, exposing said illuminated areas of resist to said beams of light until the exposed resist has set, removing unexposed resist, removing the conductive plating bared by the removal of said unexposed resist, and removing remaining resist to bare resultant conductive segments.

2. A method according to claim 1 including the additional step of electroplating said conductive segments to build up the thickness thereof.

3. A method according to claim 1 wherein said conductive plating comprises electroless copper.

References Cited by the Examiner

UNITED STATES PATENTS 2,257,143 9/1941 Wood ............... 204—15

JOHN H. MACK, *Primary Examiner.*

T. TUFARIELLO, *Assistant Examiner.*